(12) United States Patent
Shinde et al.

(10) Patent No.: US 6,827,505 B2
(45) Date of Patent: Dec. 7, 2004

(54) OPTOELECTRONIC PACKAGE STRUCTURE AND PROCESS FOR PLANAR PASSIVE OPTICAL AND OPTOELECTRONIC DEVICES

(75) Inventors: Subhash L. Shinde, Cortlandt Manor, NY (US); L. Wynn Herron, New Paltz, NY (US); Mario J. Interrante, New Paltz, NY (US); How T. Lin, Vestal, NY (US); Steven P. Ostrander, Poughkeepsie, NY (US); Sudipta K. Ray, Wappingers Falls, NY (US); William E. Sablinski, Beacon, NY (US); Hilton Toy, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 10/320,844

(22) Filed: Dec. 16, 2002

(65) Prior Publication Data

US 2004/0114884 A1 Jun. 17, 2004

(51) Int. Cl.[7] .................................................. G02B 6/36
(52) U.S. Cl. .............................. 385/92; 385/88; 385/89
(58) Field of Search ............................. 385/14, 33, 49, 385/52, 88–94

(56) References Cited

U.S. PATENT DOCUMENTS

| | | | |
|---|---|---|---|
| 5,355,429 A | 10/1994 | Lee et al. ................... | 385/136 |
| 6,075,914 A | 6/2000 | Yeandle ........................ | 385/49 |
| 6,205,264 B1 | 3/2001 | Jin et al. ...................... | 385/14 |
| 6,220,765 B1 * | 4/2001 | Tatoh ........................... | 385/94 |
| 6,227,724 B1 | 5/2001 | Verdiell ....................... | 385/91 |
| 6,270,263 B1 | 8/2001 | Iwase et al. .................. | 385/92 |
| 6,273,620 B1 | 8/2001 | Kato et al. ................... | 385/88 |
| 6,315,465 B1 | 11/2001 | Mizue et al. ................. | 385/94 |
| 2001/0001622 A1 | 5/2001 | Tatoh .......................... | 385/94 |
| 2001/0017964 A1 | 8/2001 | Setoguchi .................... | 385/88 |

* cited by examiner

Primary Examiner—Phan T. H. Palmer
(74) Attorney, Agent, or Firm—Graham S. Jones

(57) ABSTRACT

An optical-electronic package for an electronic device provides electrical connections to the electronic device and optical fiber connections to the electronic device. The package includes a high thermal conductivity base which has a pedestal to support and provide heat transfer connection to the electronic device. A seal band is formed on the base and a casing is bonded to the seal band. The casing has side feedthroughs for the electrical connections from the electronic device, and the casing has top feedthroughs or grooves for the optical fiber connections from the electronic device. A lid is hermetically sealed to the top of the casing. The lid has retractable means for forming a bend in the optical fibers to provide strain relief when the lid is placed on the casing. The retractable means for forming a bend in the optical fibers is retractable once the lid is sealed on the casing.

20 Claims, 3 Drawing Sheets

OPTOELECTRONIC PACKAGE STRUCTURE AND PROCESS FOR PLANAR PASSIVE OPTICAL AND OPTOELECTRONIC DEVICES

BACKGROUND OF THE INVENTION

1. Field of the Invention

This invention relates to optoelectronic package structures, and more particularly to structures which efficiently locate optical fibers in desired positions therein.

2. Description of Related Art

An optoelectronic package has to perform many functions. Many planar optoelectronic devices must be precisely aligned to other optical or optoelectronic components including optical fibers. The package must provide mechanical support to maintain required alignment permanently or at least for a designed end of life period. The devices dissipate an amount of heat which must be removed efficiently. Optical fibers need to be routed in and out of the package. Electrical inter-connections need to be provided, and in most cases the package has to be sealed hermetically. Thus package design is a critical issue in successful performance of such devices. A good package design will provide the above functionality in an efficient manner, but it will also ensure successful processing hierarchy, so that the process steps are sequential.

U.S. Pat. No. 6,227,724 by Verdiell for "Method for Constructing an Optoelectronic Assembly" describes an OptoElectronic (OE) module a flexible element referred to as a "flexure" which is bonded to an optical fiber, and used to align the fiber-core to a lens and a laser beam from a light-emitting device such as a laser. Alignment is performed prior to the sealing of the OE module with a separate lid. Process and alignment tooling are described for fixing the fiber in the flexure. After alignment the fiber is permanently attached to the flexure by soldering, brazing or welding. The flexure is secured to the substrate by spot welding with a laser or using UV curable adhesives to a substrate frame and to the substrate base, thereby reducing flexibility of the optical fiber since the flexure is attached to the substrate. In summary, the flexure is used to align and retain the fiber in position prior to sealing the cap hermetically.

U.S. Pat. No. 6,220,765 and divisional application U.S. patent application Publication Ser. No. 2001/0001622 A1 of Tatoh for "Hermetically Sealed Optical-Semiconductor Container and Optical-Semiconductor Module" discloses the fabrication of a sandwiched base plate laminated onto the bottom of an optical package solely to prevent warping that produces distortion of the optical signal transmitted through the optical window in a hermetic package. Two plates, each made of a material with a specific Young's modulus are laminated together to produce a structure that will not warp during the package operation temperatures. While this may be relevant to Transmitting Optical Sub Assemblies (TOSAs) and Receiving Optical Sub Assemblies (ROSAs), it less relevant to the Wave Guide Package Structure (WGPS) of this invention where in one of the plates there is a very high conductivity material that allows spreading of local hot spots on a device.

U.S. Pat. No. 6,315,465 B1 of Mizue et al. for "Optical Module" discloses a Lead Frame Base structure which is selectively etched or stamped and subsequently used to laminate additional wiring layers to accommodate the packages circuitry. The selective interconnectivity between layers in achieved by using both conductive and non-conductive epoxies. The sole purpose of this type of circuitry is to minimize the use of wire bonding as an interconnection technique that allows for tighter/shallower encapsulation which together minimizes inductance and impedance issues, yielding better electrical performance. The LED is supported and mounted externally of the encapsulated body by bending the two support leads. This has distortion issues when the temperature rises during operation. In any event, while Mizue et al. may have particular relevance in Optical Transmitter/Receiver packages it is of less relevance to the wave guide of this invention.

U.S. Pat. No. 6,270,263 B1 of Iwase et al. for "Optical Module" describes and optical module with a silicon (Si) substrate mounted with optical devices (laser and photo diodes) and with wiring pattern on it. The substrate assembly is assembled with two synthetic resin pieces (top and bottom) sealed with an adhesive. The synthetic resin package has features such as various holes and ferules in configurations which allow for optical fiber(s) to be introduced into an assembled package and to be sealed next to the laser diode by an adhesive. A synthetic resin package material which is sealed with an adhesive is consider to be non-hermetic.

U.S. Pat. No. 5,355,429 of Lee et al. for "Optical Fiber Strain Relief Apparatus" discloses apparatus for reducing optical fiber strain in a limonite structure with strain relief hardware. The hardware can consist of anchor with crimp ring and connector adapter in various configurations. In an embodiment in which the fiber is bent at an angle the emphasis is upon protection of the optical fiber from external forces which are absorbed by the anchor and protective cabling, but there is no suggestion of providing slack in the optical fiber to accommodate strain due to Coefficient of Thermal Expansion (CTE) mismatch. Moreover, there is no discussion of strain relief in optoelectronic modules or packages.

U.S. Pat. No. 6,075,914 of Yeandle for "Apparatus for Connecting an Optical Fiber to an Optical Device" discloses a method of attaching a optical fiber in a 'V' groove on a device without securing the fiber with an adhesive or solder. The securing of the fiber is on a inclined pad with adhesive away from the device which allows elastic deformation and urges the fiber into the 'V' groove, but there is no discussion of packaging thereof.

U.S. patent application Publication Ser. No. 2001/0017964 A1 of Setoguchi for "Optical Interconnection Module" describes a base formed of a high CTE material (as well as alumina). The base includes internal metallurgy, grooves for fiber alignment, multiple fiber alignment, matched index adhesives between the fiber and the laser, but there is no mention of any method for proving strain relief for the fibers nor is their any statement or concern about CTE strain in the fiber induced by the substrate during thermal excursions.

U.S. Pat. No. 6,273,620 B1 of Kato et al. for "Semiconductor Light Emitting Module" is specifically related to a fiber grating laser module where the grating is formed within the fiber and hence the oscillation length can be adjusted independent of the Semiconductor Optical Amplifier (SOA). The drawings for the module incorporated in the patent do not show features related to an optical fiber strain relief structure.

U.S. Pat. No. 6,205,264 B1 by Jin et al "Optical Assembly with Improved Dimensional Stability" describes a process of incorporation of fine dispersoid particles in various solder compositions and a resulting structure provided for improvement in the creep properties of the solders thus giving a more dimensionally stable optical assembly created using these 'improved' solders. There is no mention of a strain relief for optical fibers.

SUMMARY OF THE INVENTION

An object of this invention is to provide strain-relief in optical fibers connected to an optoelectronic package.

In accordance with this invention, an S-bend is provided in an optical fiber for strain-relief. The strain-relief S-bend is incorporated in the fiber to reduce stress on the optical fiber during thermal excursion of the package during operation of the devices contained therein and under various environmental conditions.

Further in accordance with this invention, the package includes retractable structures secured to the lid of the package. When the lid is placed in position to close the package the retractable elements are aligned with an existing fixed fiber-array which has sufficient slack to be deflected to form an S-bend without damage. The retractable structures push the optical fibers down into the package to produce strain relief S-bends in the optical fibers during the sealing of the lid of the package. The retractable structures are secured to the lid of the package. The retractable structures are composed of a material which can be retracted after use by shrinking thereof. For example, the retractable structures may be composed of porous glass or porous metal formed by powder metallurgy which can be shrunk by application of heat with a laser beam, a local hot wire above the cover or the like. Alternatively, the retractable structures can be composed of a low melting point material such as a gold-tin alloy which melts at about 280° C. and coalesces into a globule spaced well away from the optical fiber.

In accordance with another aspect of this invention, an optical-electronic package, comprises at least one active device selected from the group consisting of electronic and optoelectronic devices with electrical connections from the active device and optical fiber connections from the active device. The package is formed by a high thermal conductivity base, a casing and a lid which are and hermetically sealed together. The base has a pedestal to support and provide heat transfer connection to the active device. A casing comprising sidewalls is bonded to the base. The package has passageways for the electrical connections from the active device and passageways for the optical fiber connections from the active device. The lid, which is hermetically sealed on top of the casing, has retractable means for forming a bend in the optical fibers to provide strain relief when the lid is placed on the casing. The retractable means which form a bend in the optical fibers are retractable once the lid is sealed onto the casing.

Preferably, the pedestal and base have internal electrical connections and contact pads on the surface of the pedestal and base for active device attach or wire bond and the retractable means is formed of porous material.

Preferably, the retractable means is formed of a retractable material which adapted to be withdrawn to retracted position when heated with a focused source of radiation and the retractable material is selected from the group consisting of a porous material and a low melting point alloy which coalesces into a globule in response to application of heat thereto.

Preferably the package includes fiber supports extending from the sidewalls thereof, preferably having grooved recesses therein.

Preferably, interconnection lines are formed through the casing to the device and/or interconnection lines are formed through the base to the device.

Preferably, the base is formed of a high thermal conductivity ceramic material and interconnection lines are formed through the base to the device, and/or the base is a high conductivity structure with internal wiring and pads on the surface of the top surface of the pedestal.

In still another aspect of the invention an optical-electronic package, comprises an electronic device formed on an ancillary element selected from the group consisting of a semiconductor chip or substrate; electrical connections from the ancillary element; optical fiber connections from the ancillary element; a high thermal conductivity base, the base having a pedestal to support and provide heat transfer connection to the ancillary element; and a seal band bonded to the base. A casing is bonded to the seal band by means selected from the group consisting of soldering and brazing providing a hermetic seal thereto. The casing has side feedthroughs for the electrical connections from the ancillary element, and the package having top feedthroughs or grooves for the optical fiber connections from the ancillary element. A lid is hermetically sealed on top of the casing, the lid having retractable means for forming a bend in the optical fibers to provide strain relief when the lid is placed on the casing, the retractable means for forming a bend in the optical fibers being retractable by thermal or mechanical means once the lid is sealed on the casing.

No flexible element is used to align a fiber-array to active or passive optical devices mounted on a raised platform (wave guides or VCSELs (Vertical-Cavity Surface-emitting Lasers).

The use of a lid with internal stepped features allows for controlled fiber bending during the hermetic sealing operation. The stepped features are subsequently retracted with a secondary heating step allowing for the free "stress relieved" movement of the fiber during operation.

The present invention provides a solution for device (waveguide based on other) mounted onto a thermally conductive substrate (aluminum nitride (AlN) silicon carbide (SiC) or other) which is hermetically sealed with solder, and a cover (metal) lid.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Our invention provides a unique package design that allows us to ensure mechanical integrity of the optically aligned components, provides very good thermal management, provides a way to route multiple fibers in and out of the package without affecting its hermetic nature, provides a means for creating an S-bend in the fiber during the assembly operation to reduce the strain in the fiber, provides multiple ways to make electrical interconnections to suit the subsystem package design.

Figure 1:
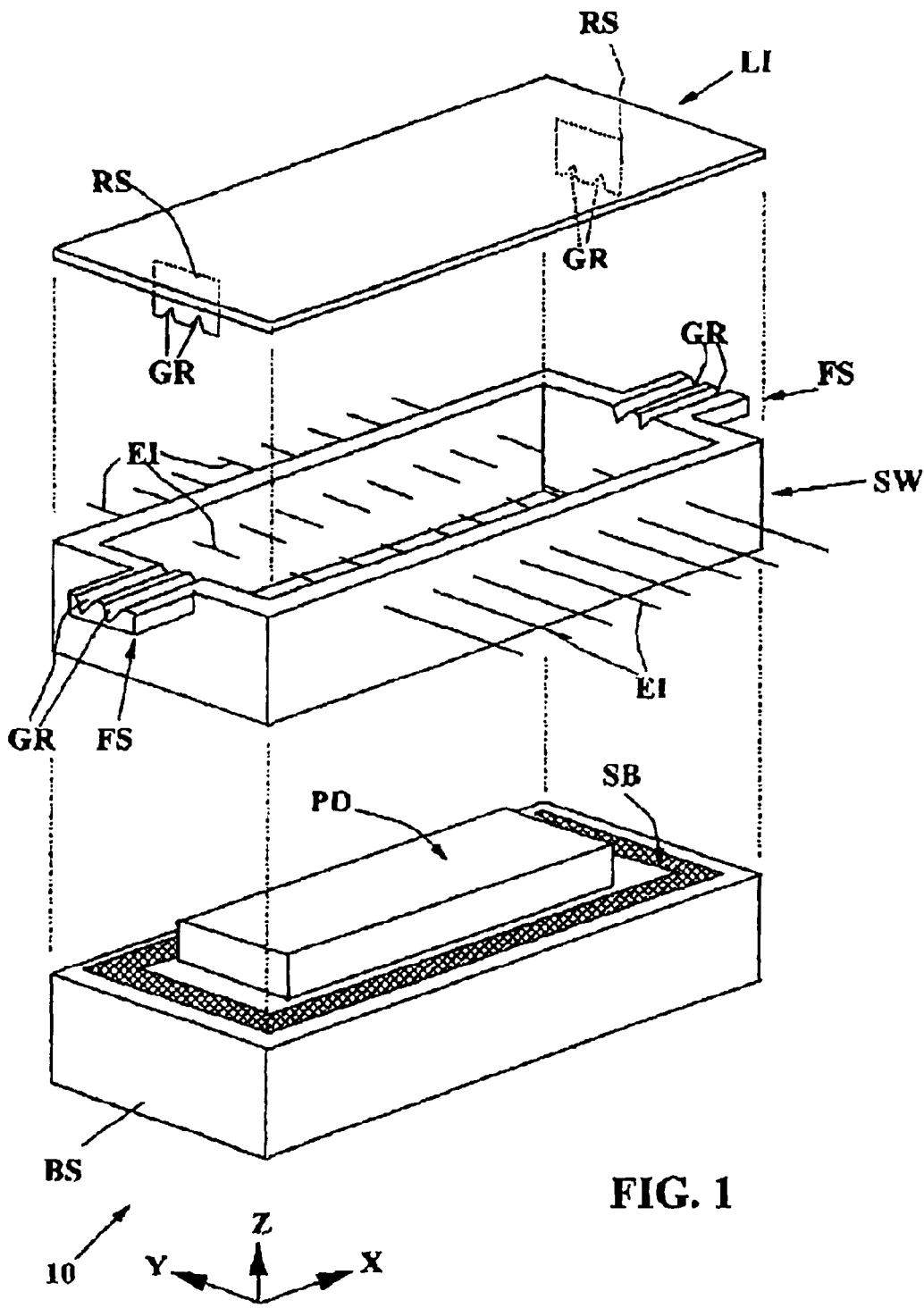
FIG. 1 shows a perspective, exploded view of elements of an optoelectronic package designed in accordance with this invention for housing an optoelectronic semiconductor chip or device

FIG. 1 shows a perspective, exploded view of elements of an optoelectronic package 10 designed in accordance with this invention for housing an optoelectronic semiconductor chip or device A base BS is provided in the form of a rectangular block with a high degree of thermal conductivity. Centered on the top surface of the base BS is a pedestal PD also in the form of a rectangular block with a high degree of thermal conductivity. The pedestal PD is shorter and narrower than the base BS leaving a margin about the periphery of the base BS. A conventional seal band SB (also known as a seal ring) is formed about the periphery of the top surface of the base BS, forming a rectangular ring about the pedestal PD.

Figure 2A:
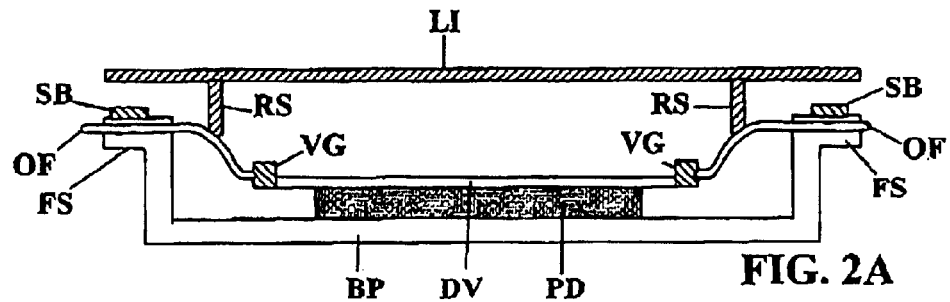
FIGS. 2A–2C are schematic drawings showing vertical sections of a simplified version of the package of FIG. 1 taken along a plane parallel to the X and Z axes in FIG. 1 showing three phases of the sealing process.
Figure 2B:
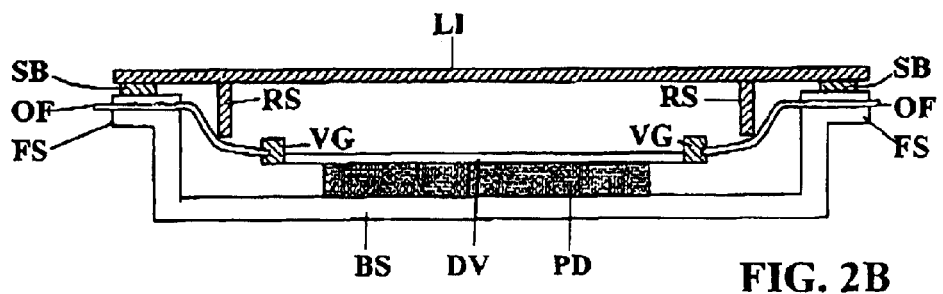
Figure 2C:
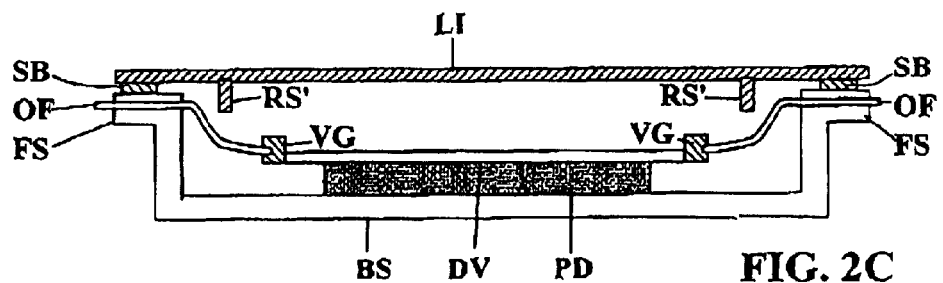

FIGS. 2A–2C are schematic drawings showing vertical sections of a simplified version of the package 10 of FIG. 1 taken along a plane parallel to the X and Z axes in FIG. 1 showing three phases of the sealing process. The optical fibers OF are shown in FIG. 2A before closure of the lid LI of the package 10 with the retractable structures RS contacting the optical fibers OF which are positioned in proper alignment by grooved recesses GR. Note that the optical fibers OF are connected to the semiconductor chip or device DV.

FIG. 2B shows the optical fibers OF with an S-bend therein after closure of lid LI, with the lid LI shown resting on the seal band SB.

FIG. 2C shows the package of FIG. 2B after the retractable structures RS have been retracted to form retracted structures RS' spaced well above the optical fibers OF to eliminate any stress thereon which would be caused by continued contact with the retractable structures RS.

In FIG. 1, a casing CS with four sidewalls and fiber supports FS on the ends is provided that is located between the base BS and the lid LI. The casing CS is bonded (by means such as brazing or soldering) to the base BS by assembly thereof and fusing or otherwise bonding the seal band SB to casing CS, providing a hermetic seal between the casing CS and the base BS.

The base BS is preferably composed of a high thermal conductivity aluminum nitride (AlN) or silicon carbide (SiC) base. The seal band SB which is fused to the casing CS and the base BS allows one to form a seal therewith by brazing a CTE matching alloy. There are several alloys which are suitable materials for the casing CS, e.g. Ni:Co:Fe/29%:17%:54% alloy such as KOVAR™ (of Carpenter) alloy available from the Ed Fagan Company, Franklin Lakes, N.J.; or Ni:Fe/42%:58% "42 Alloy".

The casing CS has provisions for providing electrically insulated sidewall vias or passageways for electrical interconnections EI as seen in FIG. 1 from the long sides thereof, as will be well understood by those skilled in the art of making hermetically sealed electrical interconnections through conductive structures. The casing CS has provisions for providing passageways for optical fiber(s) OF extending from the narrow sides thereof across the fiber supports FS as seen in FIGS. 2A and 2B. When the lid LI and the casing CS are seam sealed hermetically, the optical fibers OF are sealed hermetically also.

As stated above, the lid LI, which is used for hermetically sealing the package 10, also has the set of retractable structures RS that cause the formation of an S-bend in the optical fiber(s) OF when the lid LI is assembled onto the casing CS. The retractable structures RS can be retracted by thermal shrinkage (FIG. 2C) or mechanical deflection means once the seam sealing is complete so that the optical fiber(s) OF is/are now free to change the shape of its arc if there is relative motion between the package walls of casing CS, etc. and the central pedestal PD due to thermal gradients. The S-bend in the optical fiber(s) OF thus provides strain relief on the inside of the package 10.

Figure 3:
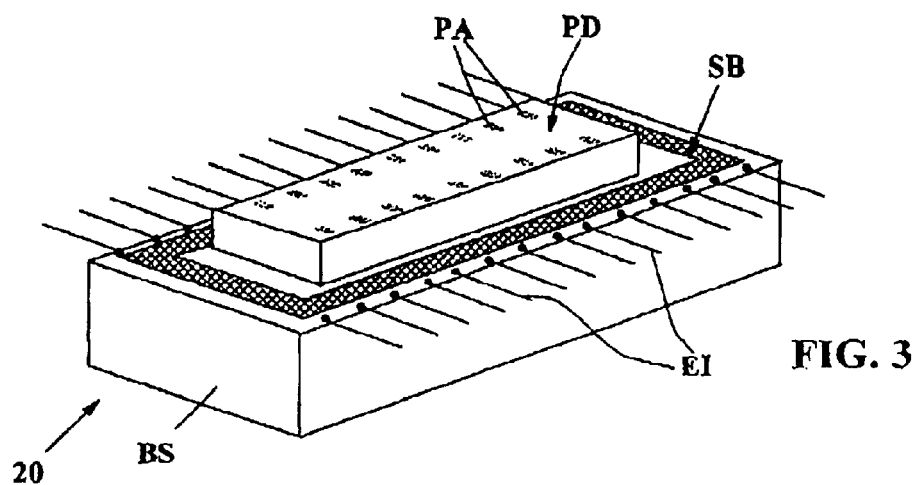
FIG. 3 shows a portion of a package embodying an alternate structure of the base and pad.

FIG. 3 shows a portion of a package 20 embodying an alternate structure of the base BS and pad PD wherein the base BS is composed of AlN or similar high thermal conductivity which includes internal wiring so that one can wirebond from a chip to wire bond pads on the base BS or even attach the chip to the wring by using flip-chip technology and second make outside electrical connections EI to the base BS, either as lead-frame or wire bond pads on the side or a pin-array on the bottom. This design flexibility provides a package design suitable to different demands of the subsystem (second level) package.

Figure 4:
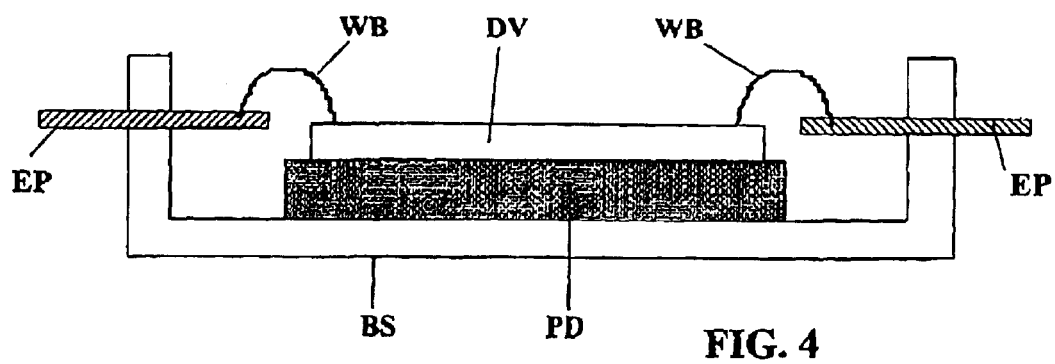
FIG. 4 is a schematic drawing showing a vertical cross-section of a simplified version of the package of FIG. 1 taken along a plane parallel to the Y and Z axes in FIG. 1 with the modification of connecting wire bonds to an electronic device resting on the pedestal which rests upon the base.

FIG. 4 is a schematic drawing showing a vertical cross-section of a simplified version of the package 10 of FIG. 1 taken along a plane parallel to the Y and Z axes in FIG. 1 with the modification of connecting wire bonds WB (fly wires) to an electronic device DV (e.g. an optoelectronic chip) resting on the pedestal PD which rests upon the base BS. There are external connection pins EP shown extending through the base BS to provide electrical connections to the wire bonds WB. The casing CS seals to the base BS as in FIGS. 1 and 2A–2C.

Figure 5:
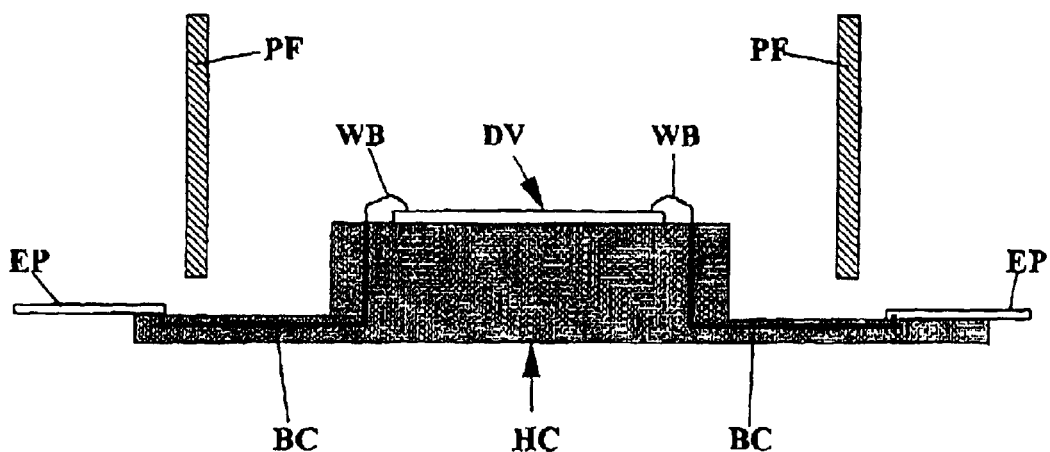
FIG. 5 is a modification of the view seen in FIG. 4 wherein the base and the pedestal have been replaced by a high thermal conductivity ceramic body with buried conductors therein reaching from outside the package to wire bonds which connect to an electronic device.

FIG. 5 is a modification of the view seen in FIG. 4 wherein the base and the pedestal have been replaced by a high thermal conductivity ceramic body HC with buried conductors BC therein reaching from outside the package to wire bonds WB which connect to the electronic device DV. The sidewalls of the package are indicated schematically by the picture frame elements PF which comprise the equivalent of casing CS. The picture frame would have four sidewalls like casing CS and would be sealed at the top as in FIGS. 1 and 2A–2C.

In summary, flexible elements are provided in the form of retractable structures RS, which are aligned to an already fixed array of optical fibers or even a single fiber OF and used to produce the S-bends therein during the sealing of the lid LI with the retractable structures RS, to the frame on the package 10. The retractable structures RS are composed of a material which can be shrunk. For example, the retractable structures RS may be composed of porous glass or porous metal formed by powder metallurgy which can be shrunk by application of heat with a laser beam, a local hot wire above the cover or the like.

Alternatively, the retractable structures can be composed of a low melting point material such as a gold-tin alloy which melts at about 280° C. and coalesces into a globule spaced well away from the optical fiber.

As stated above an optoelectronic package has to perform many functions. Many planar optoelectronic devices must be precisely aligned to other optical or optoelectronic components including optical fibers OF. The packages 10/20 provide mechanical support to maintain required alignment permanently or for the designed end of life period. The devices dissipate an amount of heat which must be removed efficiently. Optical fibers are routed in and out of the package 10. Electrical interconnections EI are provided, and in most cases the package 10 is sealed hermetically.

Composition of Retractable Structures

The retractable means is formed of a retractable material which adapted to be withdrawn to retracted position when heated with a focused source of radiation and the retractable material is selected from the group consisting of a porous material and a low melting point alloy which coalesces into a globule in response to application of heat thereto.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An optical-electronic package, comprising:
    at least one active device selected from the group consisting of electronic and optoelectronic devices;
    electrical connections from the active device;
    optical fiber connections from the active device;
    a high thermal conductivity base, the base having a pedestal to support and provide heat transfer connection to the active device;
    a casing comprising sidewalls bonded to the base;
    the package having passageways for the electrical connections from the active device,
    the package having passageways for the optical fiber connections from the active device;
    a lid hermetically sealed on top of the casing, the lid having retractable means for forming a bend in the optical fibers to provide strain relief when the lid is placed on the casing, the retractable means for forming a bend in the optical fibers being retractable once the lid is sealed on the casing.

2. The optical-electronic package of claim 1 wherein the pedestal and base have internal electrical connections and contact pads on the surface of the pedestal and base for active device attach or wire bond.

3. The optical-electronic package of claim 1 wherein the retractable means is formed of porous material.

4. The optical-electronic package of claim 1 wherein the retractable means is formed of a retractable material which adapted to be withdrawn to retracted position when heated with a focused source of radiation and the retractable material is selected from the group consisting of a porous material and a low melting point alloy which coalesces into a globule in response to application of heat thereto.

5. The optical-electronic package of claim 1 wherein the package includes fiber supports extending from the sidewalls thereof.

6. The optical-electronic package of claim 1 wherein the package includes fiber supports extending from the sidewalls thereof with grooved recesses therein.

7. The optical-electronic package of claim 1 wherein interconnection lines are formed through the casing to the device.

8. The optical-electronic package of claim 1 wherein interconnection lines are formed through the base to the device.

9. The optical-electronic package of claim 1 wherein the base is formed of a high thermal conductivity ceramic material and interconnection lines are formed through the base to the device.

10. The optical-electronic package of claim 1 wherein the base is a high conductivity structure with internal wiring and pads on the surface of the top surface of the pedestal.

11. An optical-electronic package, comprising:
    an electronic device formed on an ancillary element selected from the group consisting of a semiconductor chip or substrate;
    electrical connections from the ancillary element;
    optical fiber connections from the ancillary element;
    a high thermal conductivity base, the base having a pedestal to support and provide heat transfer connection to the ancillary element;
    a seal band bonded to the base;
    a casing bonded to the seal band by means selected from the group consisting of soldering and brazing providing a hermetic seal thereto,
    the casing having side feedthroughs for the electrical connections from the ancillary element, and the package having top feedthroughs or grooves for the optical fiber connections from the ancillary element;
    a lid hermetically sealed on top of the casing, the lid having retractable means for forming a bend in the optical fibers to provide strain relief when the lid is placed on the casing, the retractable means for forming a bend in the optical fibers being retractable by thermal or mechanical means once the lid is sealed on the casing.

12. The optical-electronic package of claim 11 wherein the pedestal and base have internal electrical connections and contact pads on the surface of the pedestal and base for device attach or wire bond.

13. The optical-electronic package of claim 11 wherein the retractable means is formed of porous material.

14. The optical-electronic package of claim 11 wherein the retractable means is formed of a retractable material which adapted to be withdrawn to retracted position when heated with a focused source of radiation and the retractable material is selected from the group consisting of a porous material and a low melting point alloy which coalesces into a globule in response to application of heat thereto.

15. The optical-electronic package of claim 11 wherein the package includes fiber supports extending from the sidewalls thereof.

16. The optical-electronic package of claim 11 wherein the package includes fiber supports extending from the sidewalls thereof with grooved recesses therein.

17. The optical-electronic package of claim 11 wherein interconnection lines are formed through the casing to the device.

18. The optical-electronic package of claim 11 wherein interconnection lines are formed through the base to the device.

19. The optical-electronic package of claim 11 wherein the base is formed of a high thermal conductivity ceramic material and interconnection lines are formed through the base to the device.

20. The optical-electronic package of claim 11 wherein the base is a high conductivity structure with internal wiring and pads on the surface of the top surface of the pedestal.

* * * * *